(12) United States Patent
Chang et al.

(10) Patent No.: US 6,919,259 B2
(45) Date of Patent: Jul. 19, 2005

(54) METHOD FOR STI ETCHING USING ENDPOINT DETECTION

(75) Inventors: Yao-Chi Chang, Tainan (TW); Jeff Lu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 295 days.

(21) Appl. No.: 10/274,707

(22) Filed: Oct. 21, 2002

(65) Prior Publication Data

US 2004/0077163 A1 Apr. 22, 2004

(51) Int. Cl.[7] ............................................. H01L 21/76
(52) U.S. Cl. ...................... 438/421; 438/424; 438/717; 438/719; 438/723; 438/724
(58) Field of Search ................................ 438/221, 226, 438/296, 421, 424, 427, 717, 719, 723, 724

(56) References Cited

U.S. PATENT DOCUMENTS

| | | | | |
|---|---|---|---|---|
| 5,413,966 A | * | 5/1995 | Schoenborn | 438/421 |
| 5,994,201 A | * | 11/1999 | Lee | 438/427 |
| 6,057,208 A | * | 5/2000 | Lin et al. | 438/424 |
| 6,140,206 A | * | 10/2000 | Li et al. | 438/424 |
| 2003/0104675 A1 | * | 6/2003 | Lim et al. | 438/424 |

* cited by examiner

*Primary Examiner*—Duy-Vu N. Deo
(74) *Attorney, Agent, or Firm*—Tung & Associates

(57) ABSTRACT

A method for dry etching a feature to control an etching depth using endpoint detection and a sacrificial hardmask including providing a substrate for etching a feature opening into said substrate, said substrate provided with at least a first dielectric layer overlying the substrate; providing at least a second dielectric layer including a sacrificial hardmask at a predetermined thickness over the at least a first dielectric layer; photolithographically patterning and etching in a first dry etching process through a thickness of the at least a second dielectric layer and the at least a first dielectric layer to expose the substrate for dry etching the feature opening; and, dry etching in a second dry etching process the substrate and the sacrificial hardmask layer to endpoint detection of an underlying layer with respect to the sacrificial hardmask layer to thereby etch through a predetermined thickness of the substrate.

20 Claims, 2 Drawing Sheets

METHOD FOR STI ETCHING USING ENDPOINT DETECTION

FIELD OF THE INVENTION

This invention generally relates to shallow trench isolation (STI) etching and more particularly to a method for controlling the depth of STI trench etching using endpoint detection.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily or permanently, noise margin degradation, voltage shift and cross-talk.

Shallow trench isolation (STI), is the preferred electrical isolation technique especially for a semiconductor chip with high integration. In general, conventional methods of producing an STI feature include first forming a hard mask over the semiconductor substrate, for example, silicon. A trench etching pattern is photolithographically patterned formed over a hard mask dielectric layer, followed by etching through the dielectric hard mask and thereafter etching a trench in the semiconducting substrate surrounding active regions to form an STI feature. Subsequently, the photoresist etching mask is removed and the STI feature is back-filled with a dielectric insulating material.

Frequently STI features are etched with a sequential process flow, where the hard mask layers are etched in one chamber and the silicon trench is etched in another chamber. Etching is frequently performed by a plasma enhanced etching process, for example reactive ion etching (RIE). Typically, in a plasma etching process an etchant source gas supplied to an etching chamber where the plasma is ignited to generate ions from the etchant source gas. Ions are then accelerated towards the process wafer substrate, frequently by a voltage bias, where they remove material (etch) from the process wafer. Various gas chemistries are used to provide variable etching rates for different etching target materials. Frequently used etchant sources include chlorine and bromine based etchants, for example $Cl_2$ and HBr.

It is frequently desirable to use an etching endpoint detection system in plasma enhanced etching to control a depth of etching. For example, For example, in plasma etching endpoint detection systems monitor parameters such as a change in the etch rate, the type of etch products, or a change in the active reactants in the gas discharge. For example, optical emission spectroscopy (OES) has been widely used for endpoint detection by monitoring the intensity of wavelengths of either reactive species or etching products. More specifically, during an RIE process, plasma discharge materials, such as etchant, neutral, and reactive ions in the plasma, are continuously excited by electrons and collisions, giving off emissions ranging from ultraviolet to infrared radiation. An optical emission spectrometer diffracts this light into its component wavelengths and determines the intensity at a particular wavelength. Since each species emits light at a wavelength characteristic only of that species, it is possible to associate a certain wavelength with a particular species, and to use this information to detect an etching endpoint.

In forming a feature in a layer of material in a multilayer semiconductor device, an etching process typically etches away one type of material included in one layer of the device until another different layer of material, which typically has a low selectivity to etching, is reached, for example, an etch stop layer. Since the etch stop layer is typically a different material having a low reactivity with the reactive ion species, a discernible change in either or both the concentration of reactive ion species and the reactively etched species may be easily observed. Since the concentration of given plasma species is proportional to an emitted wavelength of light, the concentration of a given species may be tracked by monitoring the intensity at a given wavelength.

One problem with end-point detection using OES or any other plasma species monitoring method occurs where no change in material during etching, such as a material interface, is present during the etching process thereby providing no readily discernable change in reactive species or reactively etched (product) species. There are several applications, however, where no material interface is present, yet a particular feature etching depth is required, for example, in etching a STI trench in a silicon substrate.

According to prior art processes for anisotropically etching STI trench features, a predetermined etching time period is pre-programmed with associated plasma operating conditions for achieving a pre-determined etching depth. Control of the depth of STI features is critical to proper integrated circuit device functioning including achieving a proper sidewall taper and rounded corners at the trench bottoms and tops to improve electrical isolation properties. As device sizes are diminished, using pre-determined time based dry etching (plasma enhanced) makes precise trench depths increasingly difficult to control. Small variations in the plasma parameters during the etching process can lead to significant trench depth variations. Slight variations in plasma etching parameters are magnified over an etching time period to result in a significant deviation from the desired trench depth.

There is therefore a need in the integrated circuit semiconductor device processing art to develop a plasma enhanced etching process whereby etching depths can be more precisely controlled.

It is therefore an object of the invention to provide a plasma enhanced etching process whereby etching depths can be more precisely controlled while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for dry etching a feature to control an etching depth using endpoint detection and a sacrificial hardmask.

In a first embodiment, the method includes providing a substrate for etching a feature opening into said substrate, said substrate provided with at least a first dielectric layer overlying the substrate; providing at least a second dielectric layer including a sacrificial hardmask at a predetermined thickness over the at least a first dielectric layer; photolithographically patterning and etching in a first dry etching process through a thickness of the at least a second dielectric layer and the at least a first dielectric layer to expose the substrate for dry etching the feature opening; and, dry etching in a second dry etching process the substrate and the sacrificial hardmask layer to endpoint detection of an underlying layer with respect to the sacrificial hardmask layer to thereby etch through a predetermined thickness of the substrate.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the etching of a shallow trench isolation (STI) trench feature, it will be appreciated that the method of the present invention of using a sacrificial hard mask to provide an endpoint detectable change in plasma species concentration may be used in the etching of any semiconductor feature where it would be advantageous to control a trench etching depth in a substrate lacking a material interface or otherwise providing a endpoint detectable change in plasma species concentration. In addition, it will be appreciated that any endpoint detection means for determining a plasma species signal proportional to a plasma species concentration may be used as the endpoint detection means including, for example, optical emission spectroscopy (OES), mass spectroscopy, infrared emission spectroscopy, including a combination of the foregoing.

In an exemplary embodiment, a silicon substrate is provided with an overlying first oxide layer and a first dielectric layer overlying the first oxide layer. A second silicon oxide layer is formed over the first dielectric layer and a second dielectric layer is formed over the second dielectric layer. A layer of photoresist is deposited and a photolithographic patterning and first dry etching process is carried out to etch a feature opening to reveal the silicon substrate and form a hard etching mask. The photoresist layer is removed and the silicon substrate is dry etched in a second dry etching process to simultaneously etch the second dielectric layer of the hard etching mask to endpoint detection of the second oxide layer to control a silicon substrate etching depth. Preferably the second dielectric layer includes a chemical formulation such that an etching endpoint in a dry etching process is detectable on etching through the sacrificial hardmask layer and exposing an underlying layer, for example the silicon oxide layer.

Figure 1A:
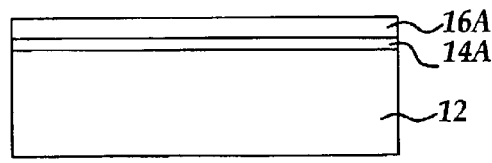
FIGS. 1A–1F are cross sectional side view representations of a portion of a semiconductor device at stages in manufacture according to an exemplary embodiment of the present invention.

Referring to FIGS. 1A–1F, in an exemplary implementation of the method of the present invention, are shown cross-sectional side views of a portion of a semiconductor device at stages in processing a semiconductor wafer to form a shallow trench isolation feature. Referring to FIG. 1A, is shown a silicon substrate 12, having an overlying pad oxide layer 14A of thermally grown silicon oxide. The pad oxide layer 14A is grown by conventional processes, and comprises a thin $SiO_2$ layer, also referred to as an initial oxide or sacrificial oxide, and is thermally grown over exposed portions of a silicon substrate 12 having a thickness of about 100 to 150 Angstroms, for example about 110 Angstroms. For example, the pad oxide 14A is thermally grown at temperatures from about 800° C. to about 1000° C., for example by rapid thermal oxidation (RTO) processes to minimize the time at elevated temperatures. The pad oxide 14A serves several purposes including relieving stress in the silicon substrate to reduce surface defects and protecting the underlying silicon substrate from chemical contamination during subsequent processing steps, for example, acting as an etch stop during phosphoric acid stripping of an overlying dielectric layer following shallow trench isolation (STI) formation.

Still referring to FIG. 1A, a first dielectric layer 16A, for example a nitride layer, preferably silicon nitride (e.g., $Si_3N_4$) is deposited by a conventional LPCVD or PECVD process over the pad oxide layer to a thickness of about 1500 Angstroms to about 1800 Angstroms, for example about 1625 Angstroms.

Figure 1B:
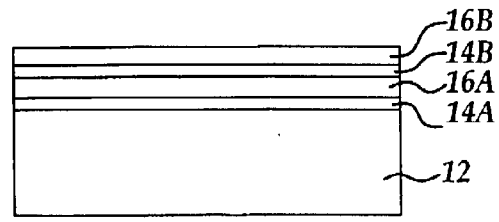

Referring to FIG. 1B, according to an aspect of the invention, a second oxide layer 14B, preferably silicon oxide (e.g., $SiO_2$) is formed over the first dielectric layer 16A. Preferably, the silicon oxide layer 14B is thermally grown in a similar manner as the first oxide layer 14A. It will be appreciated however, that the oxide layer may be formed by other conventional deposition processes including LPCVD or PECVD. For example, a silicon oxide layer deposited by PECVD may be optionally thermally annealed at temperatures from about 800° C. to about 1000° C. in oxygen to densify the oxide to resemble the qualities of a thermally grown oxide.

Still referring to FIG. 1B, following deposition of the second oxide layer 14B, a second dielectric layer 16B, preferably a metal nitride layer, for example silicon nitride, is formed over the second oxide layer 14B in the same manner as the first dielectric layer to form a sacrificial hard mask. Preferably, the second dielectric layer is formed having a predetermined etching selectivity with respect to silicon in a dry etching process. For example, preferably, the second dielectric layer 16B has an etching selectivity with respect to silicon in a dry etching process that is from about 1:2 to about 1:4, more preferably about 1:3. For example, with an etching selectivity of the second dielectric layer of about 1:3 with respect to silicon, etching through a thickness of about 1000 Angstroms of the exposed second dielectric layer would etch through an exposed silicon thickness of about 3000 Angstroms under the same dry etching conditions and etching time period.

In an exemplary implementation, the second silicon oxide layer 14B is deposited to a thickness of about 400 Angstroms to about 600 Angstroms and the second dielectric layer, for example silicon nitride, is deposited at a thickness of about 800 Angstroms to about 1200 Angstroms. For example, preferably, the second dielectric layer is deposited to a thickness, such that in a subsequent dry etching process the silicon substrate 12 will be etched to a predetermined depth determined by the thickness and etching selectivity of the second dielectric layer 16B with respect to the silicon substrate. For example, in an STI trench etching process, the STI trench is etched in the silicon substrate 12 to a depth of about 2000 Angstroms to about 5000 Angstroms, more preferably, about 3000 Angstroms.

Figure 1C:
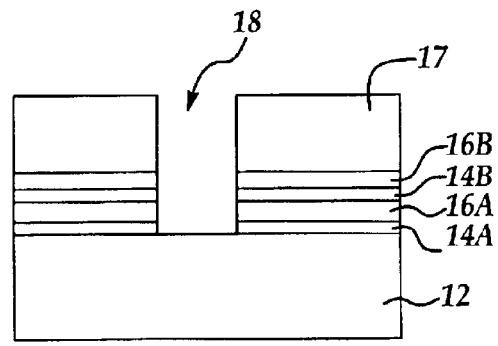

Referring to FIG. 1C, a photoresist layer 17 is deposited and photolithographically patterned according to a conventional process to pattern an etching mask for dry etching STI features. A conventional first dry etching process, for example a reactive ion etching (RIE) process using a conventional fluorocarbon and/or hydrofluorocarbon etching chemistry with oxygen and/or nitrogen is carried out to anisotropically etch a hard mask opening 18 through a thickness of the second dielectric layer 16B, the second oxide layer, 14B, the first dielectric layer 16A, and the first oxide layer 14A, to reveal the silicon substrate 12.

Figure 1D:
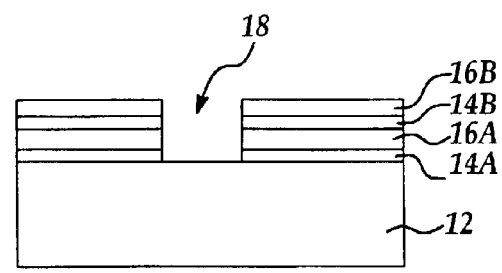
Figure 1E:
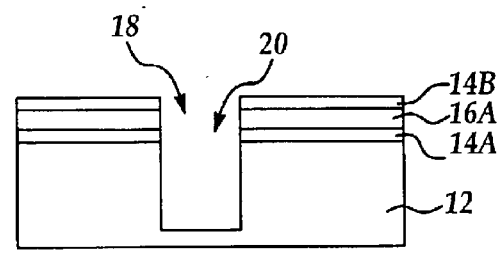

Referring to FIG. 1D, according to the present invention, following removal the photoresist layer 17, is tripped exposing the second dielectric layer 16B and the silicon substrate 12. Referring to FIG. 1E, following striping of the photoresist layer, a second dry etching process is carried out to simultaneously etch through a thickness of the silicon substrate 12 to form STI trench 20. The depth of the STI trench is determined by an etching rate of the second dielectric layer 16B functioning as a sacrificial hard mask and etched to expose the oxide layer 14B. For example, the first etching process is carried out in a separate oxide etcher optimized for oxide and nitride etching while the second dry etching process is carried out in a separate silicon etcher optimized for etching silicon. Preferably the second dry etching chemistry includes chlorine, for example including chlorine and oxygen. It will be appreciated that other etching chemistries with higher silicon etching rates may be used as well including, for example, a bromine/chlorine based etching chemistry to achieve a predetermined silicon substrate etching depth. Preferably, the second dry etching process includes an etching chemistry having an etching rate of the second dielectric layer, for example silicon nitride, compared to an etching rate of the silicon substrate (etching selectivity of silicon nitride with respect to silicon) of about 1:2 to about 1:4, more preferably about 1:3.

According to another aspect of the invention, during the second dry etching process, an end-point detection means is used to determine an etching endpoint upon exposing the second oxide layer 14B. For example, the plasma species monitoring system is preferably capable of tracking a signal of at least one of the plasma reactant and product species over time in a plasma etch (dry etching) process. For example, the plasma species monitored preferably includes one of carbon monoxide (CO) or cyanide (e.g., CN). For example, optical emission spectroscopy (OES) may be used as is known in the art to obtain multiple wavelength or single wavelength information on plasma species emission and to determine an etching endpoint based on changes in plasma species emission signal intensity.

Still referring to FIG. 1E, in operation, the second dry etching process is carried out to dry etch, in parallel, the sacrificial hard mask layer 16B and the silicon substrate 12. For example, in one exemplary implementation of the dry etching process an etching rate of the second dielectric layer 16B (e.g., $Si_3N_4$) compared to an etching rate of the silicon substrate 12 is about 1:3 where the silicon nitride layer is about 1000 Angstroms in thickness. As a result, an STI trench depth e.g., 20, of about 3000 Angstroms is etched into the silicon substrate 12 at endpoint detection corresponding to exposure of at least a portion of the second oxide layer 14B.

Figure 1F:
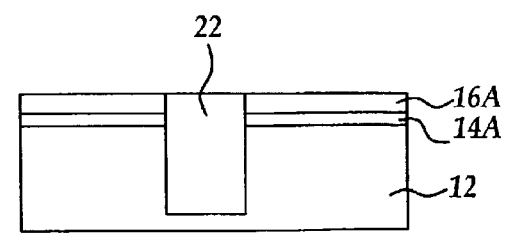

Referring to FIG. 1F, subsequent conventional processes are carried out to complete the formation of the STI structure including, for example, thermally growing an oxide to line the STI trench (not shown), backfilling with CVD silicon oxide 22, and CMP to planarize the backfilled CVD silicon oxide at about the first silicon nitride layer 16A level.

Thus, a method has been presented for controllably dry etching a STI trench depth by using a sacrificial hard mask silicon nitride layer and an endpoint detection means, for example OES to determine an etching endpoint of the sacrificial hard mask to control a silicon etching depth. As a result, an STI trench etching depth may be more accurately controlled avoiding depth deviations due to variations in plasma operating parameters thereby improving device performance and reliability.

Figure 2:
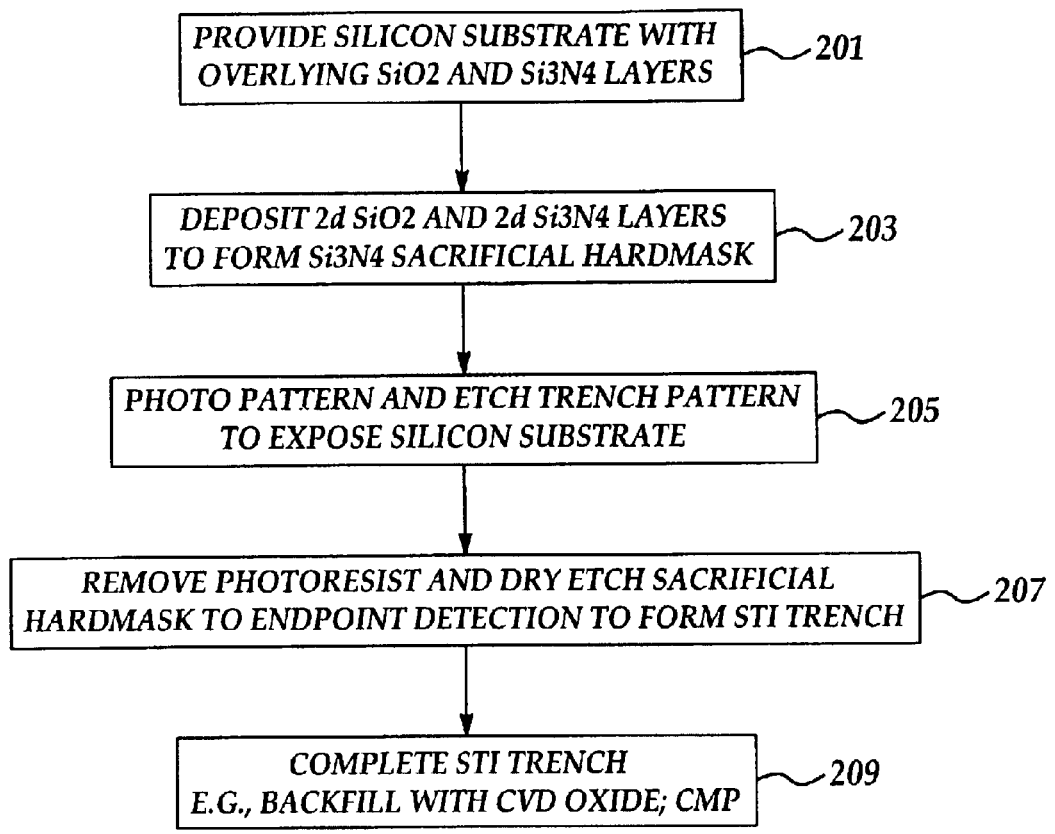
FIG. 2 is a process flow diagram including several embodiments of the present invention.

For example referring to FIG. 2 is a process flow diagram including several embodiments of the present invention. In process 201, a silicon substrate is provided with an overlying first silicon oxide layer and a first silicon nitride layer overlying the thermal grown oxide layer. In process 203, a second silicon oxide layer is formed over the first silicon nitride layer and a second silicon nitride layer forming a sacrificial hard mask is formed over the second silicon oxide layer. In process 205, a photolithographic patterning and first etching process is carried out to expose the silicon substrate and form a hard mask for STI trench etching. In process 207, a second dry etching process is carried out with a chlorine based etching chemistry with the sacrificial hard mask and silicon substrate exposed to etch to endpoint detection of the second silicon oxide layer. In process 209, subsequent STI formation processes are carried out including thermally growing an oxide liner in the STI trenches, backfilling with CVD silicon oxide, and silicon oxide CMP.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for dry etching a feature to control an etching depth using endpoint detection and a sacrificial hardmask comprising the steps of:

providing a substrate for etching a feature opening into said substrate, said substrate provided with at least a first dielectric layer overlying the substrate;

providing at least a second and uppermost dielectric layers comprising a sacrificial hardmask having a predetermined thickness over the at least a first dielectric layer;

photolithographically patterning and etching in a first dry etching process through a thickness of the at least a second and uppermost dielectric layers and the at least a first dielectric layer to expose the substrate for dry etching a feature opening; and, dry etching in a second dry etching process the substrate and the sacrificial hardmask layer while simultaneously etching the substrate to endpoint detection of the second dielectric layer to thereby etch through a predetermined thickness of the substrate comprising the feature opening.

2. The method of claim 1, wherein the second dry etching process produces an etching rate of the sacrificial hardmask layer compared to the substrate of about 1:2 to about 1:4.

3. The method of claim 1, wherein the etching endpoint is determined by a plasma species signal during the second dry etching process selected from the group consisting of optical emission spectra and mass spectra.

4. The method of claim 1, wherein the uppermost dielectric layer comprises a nitride and the second dielectric layer comprises an oxide.

5. The method of claim 1, wherein, the at least a first dielectric layer comprises a silicon nitride layer overlying a silicon oxide layer.

6. The method of claim 1, wherein the feature opening comprises a shallow trench isolation (STI) trench and the substrate comprises silicon.

7. The method of claim 1, wherein the second dry etching process comprises a chlorine containing etching chemistry.

8. The method of claim 1, wherein the sacrificial hardmask has a predetermined thickness of about 500 nm to about 1500 nm.

9. The method of claim 1, wherein the sacrificial hardmask has an etching rate compared to the substrate of about 1:2 to about 1:4.

10. The method of claim 1, wherein the feature opening is formed having a depth in the substrate of about 2000 Angstroms to about 5000 Angstroms.

11. A method for controllably dry etching a shallow trench isolation (STI) trench depth using endpoint detection and a sacrificial hardmask comprising the steps of:

providing a silicon substrate for etching a shallow trench isolation (STI) trench, said substrate provided with a first silicon oxide layer overlying the silicon substrate and a first silicon nitride layer overlying the silicon oxide layer;

providing an oxide layer overlying the first silicon nitride layer and a nitride layer overlying the oxide layer forming a sacrificial hardmask having a predetermined thickness over the oxide layer;

photolithographically patterning and performing a first dry etching process to expose the silicon substrate to form an STI trench dry etching pattern; and, performing a second dry etching process to simultaneously etch the silicon substrate and the sacrificial hardmask to endpoint detection of the oxide layer to controllably etch a predetermined STI trench depth.

12. The method of claim 11, wherein the oxide layer comprises silicon oxide and the nitride layer comprises a nitride selected from the group consisting of silicon nitride, tantalum nitride, and titanium nitride.

13. The method of claim 11, wherein the second dry etching process produces an etching rate of the sacrificial hardmask layer compared to the silicon substrate of about 1:2 to about 1:4.

14. The method of claim 11, wherein the etching endpoint is determined by a plasma species signal during the second dry etching-process selected from the group consisting of optical emission spectra and mass spectra.

15. The method of claim 14, wherein the plasma species comprises at least one of CO and CN.

16. The method of claim 11, wherein the second dry etching process comprises a chlorine containing etching chemistry.

17. The method of claim 11, wherein the STI trench depth is etched to a predetermined depth of about 2000 Angstroms to about 5000 Angstroms.

18. The method of claim 11, wherein an etching selectivity of the sacrificial hardmask with respect to an etching selectivity of the silicon substrate is selected to produce a predetermined STI trench depth.

19. The method of claim 18, wherein the thickness of the sacrificial hardmask is selected to produce a predetermined STI trench depth.

20. A method for controllably dry etching a trench depth using endpoint detection and a sacrificial hardmask comprising the steps of:

providing a substrate comprising a first nitride layer on a first oxide layer overlying silicon;

forming a sacrificial hardmask comprising a second oxide layer on the first nitride layer and a second nitride layer on the second oxide layer, the nitride layer formed at a predetermined thickness;

patterning the sacrificial hardmask and the substrate to expose the silicon for etching a trench therein; and, simultaneously dry etching the sacrificial hardmask and the silicon to endpoint detection of the second oxide layer to produce a predetermined trench depth.

* * * * *